United States Patent
Kurihara

(10) Patent No.: US 9,065,420 B2
(45) Date of Patent: Jun. 23, 2015

(54) FABRICATION METHOD OF ACOUSTIC WAVE DEVICE

(75) Inventor: Tomo Kurihara, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 352 days.

(21) Appl. No.: 13/610,374

(22) Filed: Sep. 11, 2012

(65) Prior Publication Data

US 2013/0076205 A1    Mar. 28, 2013

(30) Foreign Application Priority Data

Sep. 26, 2011   (JP) .................................. 2011-209289

(51) Int. Cl.
*H04R 31/00*   (2006.01)
*H03H 3/08*   (2006.01)
*H03H 9/05*   (2006.01)
*H03H 9/10*   (2006.01)

(52) U.S. Cl.
CPC ............... *H03H 3/08* (2013.01); *H03H 9/0542* (2013.01); *H03H 9/1071* (2013.01)

(58) Field of Classification Search
USPC ............. 29/25.35, 417, 594, 595, 609.1, 835, 29/841, 844, 855; 310/313 D, 313 R, 320, 310/366; 333/150, 187, 193, 195, 196
See application file for complete search history.

(56) References Cited

U.S. PATENT DOCUMENTS

| | | | |
|---|---|---|---|
| 6,534,901 B1 * | 3/2003 | Tsuzuki et al. | 310/348 |
| 6,643,920 B2 * | 11/2003 | Hori | 29/832 |
| 6,815,869 B2 * | 11/2004 | Baba et al. | 310/313 R |
| 7,513,022 B2 * | 4/2009 | Shimada et al. | 29/25.35 |
| 7,935,573 B2 * | 5/2011 | Mizukoshi | 438/109 |
| 8,677,604 B2 * | 3/2014 | Kando | 29/594 |
| 2007/0126087 A1 * | 6/2007 | Owaki et al. | 257/664 |
| 2011/0278722 A1 * | 11/2011 | Miki | 257/737 |

FOREIGN PATENT DOCUMENTS

JP    09162690 A   *  6/1997
JP    2004-129193 A    4/2004

* cited by examiner

*Primary Examiner* — Paul D Kim
(74) *Attorney, Agent, or Firm* — Chen Yoshimura LLP

(57) ABSTRACT

A fabrication method of an acoustic wave device includes: forming acoustic wave elements on a first substrate; forming protrusion electrodes and seal rings on the first substrate simultaneously by an electrolytic plating method, the protrusion electrodes being electrically connected to the acoustic wave elements, each of the seal rings surrounding related acoustic wave elements out of the acoustic wave elements and related protrusion electrodes out of the protrusion electrodes electrically connected to the related acoustic wave elements; and cutting a plating power-supply line used in the electrolytic plating method in a step of dividing the first substrate into pieces each including a corresponding one of the seal rings so as to electrically separate the related acoustic wave elements from the corresponding one of the seal rings.

8 Claims, 10 Drawing Sheets

FABRICATION METHOD OF ACOUSTIC WAVE DEVICE

CROSS-REFERENCE TO RELATED APPLICATION

This application is based upon and claims the benefit of priority of the prior Japanese Patent Application No. 2011-209289, filed on Sep. 26, 2011, the entire contents of which are incorporated herein by reference.

FIELD

A certain aspect of the present invention relates to an acoustic wave device and a fabrication method of the same.

BACKGROUND

Acoustic wave devices are used for filters and the like of wireless terminals such as mobile phone terminals, for example. Exemplary acoustic wave elements used for an acoustic wave device are a surface acoustic wave element in which an IDT (Interdigital Transducer) electrode is formed on a piezoelectric substrate, and a piezoelectric thin film resonant element in which a piezoelectric film is sandwiched by upper and lower electrodes.

An acoustic wave device using an acoustic wave is required to have a space above a functional part of an acoustic wave element to maintain characteristics of the acoustic wave element. The functional part of the acoustic wave element includes an electrode finger of an IDT electrode in the surface acoustic wave element, and includes a region where upper and lower electrodes sandwiching a piezoelectric film overlap in the piezoelectric thin film resonant element. The above requirement may be met by a structure designed to have a sealing portion having a cavity provided above the functional part of the acoustic wave element. Such a structure is so called a hollow structure.

For example, Japanese Patent Application Publication No. 2004-129193 discloses a technique that defines a sealed space above an IDT electrode by bonding a piezoelectric substrate with a surface acoustic wave element being formed therein to a base substrate. More specifically, after forming a connection electrode for making a connection with the element and a periphery sealing conductor film on the base substrate, a solder bump member (protrusion electrode) is formed on the electrode, and a solder bonding member (seal ring) is formed on the periphery sealing conductor film. The next step is to form the IDT electrode, the connection electrode, and the periphery sealing electrode on the piezoelectric substrate. Then, a sealed space is formed above the IDT electrode by bonding the electrode to the solder bump member and bonding the periphery sealing electrode to the solder bonding member.

In a case where the acoustic wave element is hermetically sealed by bonding the substrate with the acoustic wave element to a mounting substrate, the use of separate processes for forming the protrusion electrode and the seal ring on the substrate increases the number of fabrication steps and the cost. The protrusion electrode has a function of electrically connecting the acoustic wave element to the external, and the seal ring has a function of hermetically sealing the acoustic wave element. In addition, the use of the separate processes for forming the protrusion electrode and the seal ring makes it difficult to equalize the height of the protrusion electrode and the height of the seal ring to each other. Thus, the protrusion electrode may not be electrically connected to the mounting substrate to cause poor electrical characteristics, or the seal ring may not be bonded to the mounting substrate to cause a problem in hermetical seal. Thus, it is preferable that the protrusion electrode and the seal ring are formed simultaneously. When electrolytic plating is used to form the protrusion electrode and the seal ring, simultaneous forming of the protrusion electrode and the seal ring may be achieved by using a plating power-supply line that is electrically unified so as to be connected to both of the protrusion electrode and the seal ring.

However, the use of electrolytic plating may need another process of removing a part of the plating power-supply line to separate the protrusion electrode and the seal ring from each other. The removing step increases the number of fabrication steps and gives an opportunity that a foreign material adheres.

SUMMARY OF THE INVENTION

According to an aspect of the present invention, there is provided a fabrication method of an acoustic wave device including: forming acoustic wave elements on a first substrate; forming protrusion electrodes and seal rings on the first substrate simultaneously by an electrolytic plating method, the protrusion electrodes being electrically connected to the acoustic wave elements, each of the seal rings surrounding related acoustic wave elements out of the acoustic wave elements and related protrusion electrodes out of the protrusion electrodes electrically connected to the related acoustic wave elements; and cutting a plating power-supply line used in the electrolytic plating method in a step of dividing the first substrate into pieces each including a corresponding one of the seal rings so as to electrically separate the related acoustic wave elements from the corresponding one of the seal rings.

According to another aspect of the present invention, there is provided an acoustic wave device including: an acoustic wave element on a first substrate; a protrusion electrode that is provided on the first substrate and is electrically connected to the acoustic wave element; a first wiring that is provided on the first substrate, extends from an edge of the first substrate, and is electrically connected to the protrusion electrode; a seal ring that is provided on the first substrate, surrounds the acoustic wave element and the protrusion electrode, and is electrically separated from the protrusion electrode by intersecting with the first wiring with a three-dimensional wiring structure; and a second wiring that is provided on the first substrate and extends from the edge of the first substrate, the second wiring being electrically connected to the seal ring, and being electrically separated from the first wiring.

DETAILED DESCRIPTION

A description will now be given of an acoustic wave device in accordance with a first comparative example first. FIG. 1A through FIG. 1D are cross-sectional schematic views of the acoustic wave device in accordance with the first comparative example. FIG. 2A through FIG. 3B are top schematic views illustrating a fabrication method of the acoustic wave device in accordance with the first comparative example. A bare chip mounting type acoustic wave device is fabricated by using a piezoelectric substrate in a wafer state. Although the wafer has a region in which multiple acoustic wave devices are to be formed, only one of the acoustic wave devices is illustrated and described in FIG. 1A through FIG. 3B for the sake of convenience.

Figure 1A:
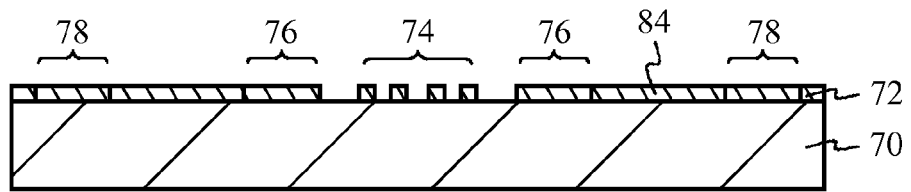
FIG. 1A through FIG. 1D are cross-sectional schematic views illustrating a fabrication method of an acoustic wave device in accordance with a first comparative example.
Figure 2A:
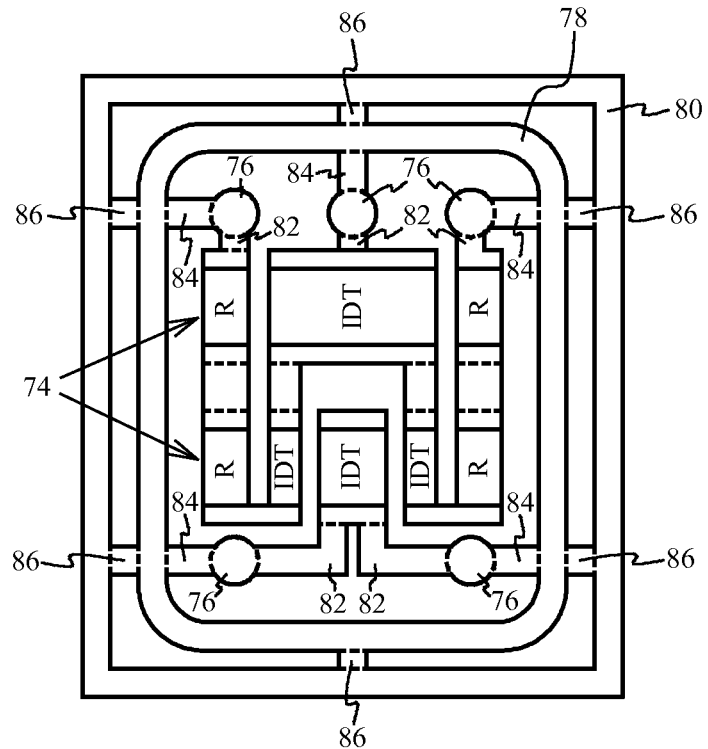
FIG. 2A and FIG. 2B are top schematic views (No. 1) illustrating the fabrication method of the acoustic wave device in accordance with the first comparative example.

Referring to FIG. 1A and FIG. 2A, a metal layer 72 including IDT electrodes, reflection electrodes R and wirings is formed on a piezoelectric substrate 70 so as to form surface acoustic wave elements 74 on the piezoelectric substrate 70. In addition, the metal layer 72 is formed in regions 76 in which pad electrodes are to be formed, in a region 78 in which a circular electrode is to be formed, and in a cutting region 80 for dicing. Furthermore, the metal layer includes wirings 82, 84 and 86. The wirings 82 interconnect the surface acoustic wave elements 74 and the metal layers 72 of regions 76. The wirings 84 interconnect the metal layers 72 of the regions 76 and the metal layer 72 of the region 78. The wirings 86 connect the metal layer 72 of the region 78 and the metal layer 72 of the cutting region 80 together.

Figure 1B:
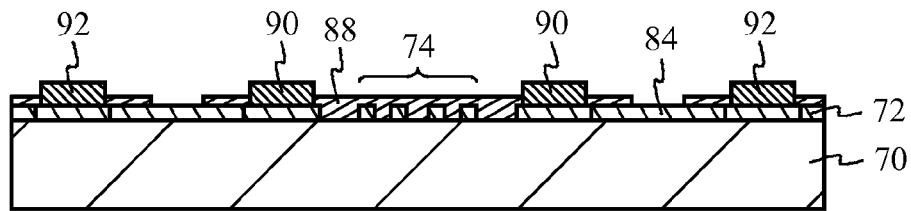
Figure 2B:
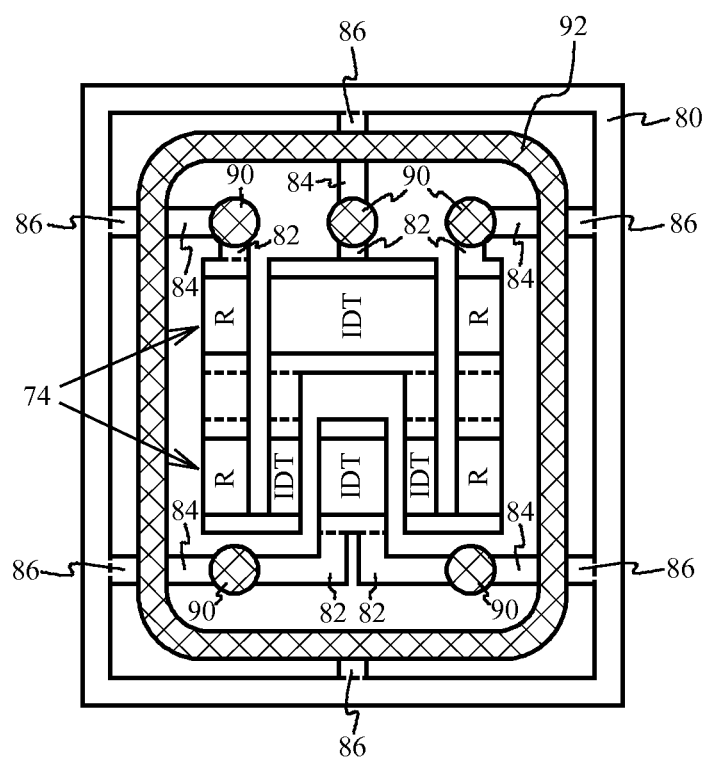

Referring to FIG. 1B and FIG. 2B, a protective film 88 is formed on the piezoelectric substrate 70 so as to cover surface acoustic wave elements 74. In FIG. 2B, the protective film 88 is illustrated transparently (this applies to FIG. 3A and FIG. 3B). Then, the protective film 88 on regions 76, the region 78 and wirings 84 is removed. After that, pad electrodes 90 are formed on the metal layers 72 of the regions 76, and a circular electrode 92 is formed on the metal layer 72 of the region 78. Accordingly, pad electrodes 90 are electrically connected to surface acoustic wave elements 74, and the circular electrode 92 is formed to surround the surface acoustic wave elements 74 and the pad electrodes 90.

Figure 1C:
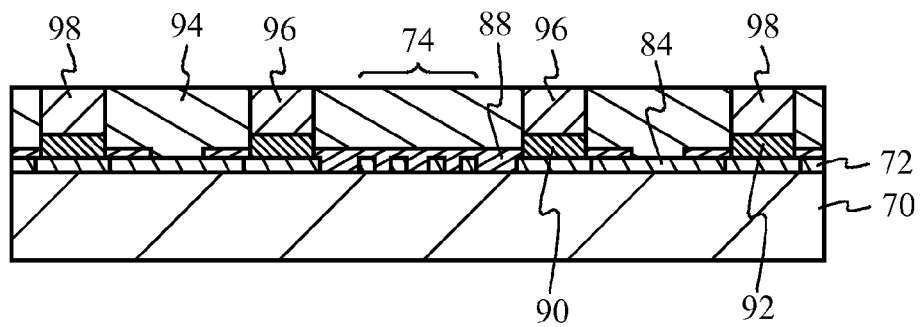
Figure 3A:
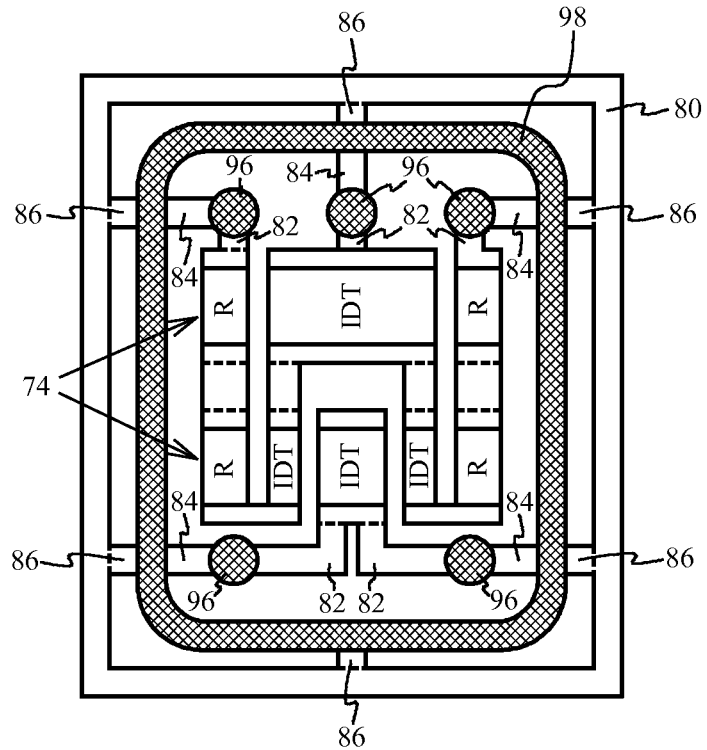
FIG. 3A and FIG. 3B are top schematic views (No. 2) illustrating the fabrication method of the acoustic wave device in accordance with the first comparative example.

Referring to FIG. 1C and FIG. 3A, the piezoelectric substrate 70 is coated with a photoresist 94, which is then patterned to form apertures above the pad electrodes 90 and the circular electrode 92. In FIG. 3A, the photoresist 94 is illustrated transparently. Within apertures, protrusion electrodes 96 and a seal ring 98 are simultaneously formed on the pad electrodes 90 and the circular electrode 92 respectively by the electrolytic plating method. Accordingly, the protrusion electrodes 96 are electrically connected to the surface acoustic wave elements 74, and the seal ring 98 is formed to surround the surface acoustic wave elements 74 and the protrusion electrodes 96.

The metal layer 72 of the cutting region 80 is electrically connected to the circular electrode 92 via the wirings 86, and the circular electrode 92 is electrically connected to the pad electrodes 90 via the wirings 84. As the metal layer 72 in the cutting region 80 is provided to extend in the entire surface of the piezoelectric substrate 70 in the wafer state, it is possible to flow a current to the pad electrodes 90 and the circular electrode 92 across the entire surface of the wafer via the metal layer 72 in the cutting region 80 by connecting an electrode for electrolytic plating to an outer periphery portion of the wafer. Accordingly, it is possible to form the protrusion electrodes 96 and the seal ring 98 simultaneously by the electrolytic plating method. That is to say, the protrusion electrodes 96 and the seal ring 98 are formed of a same material and have a same film thickness.

Figure 1D:
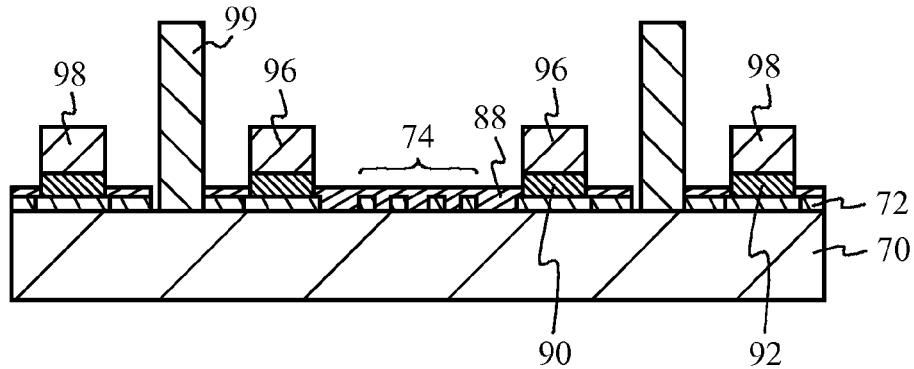
Figure 3B:
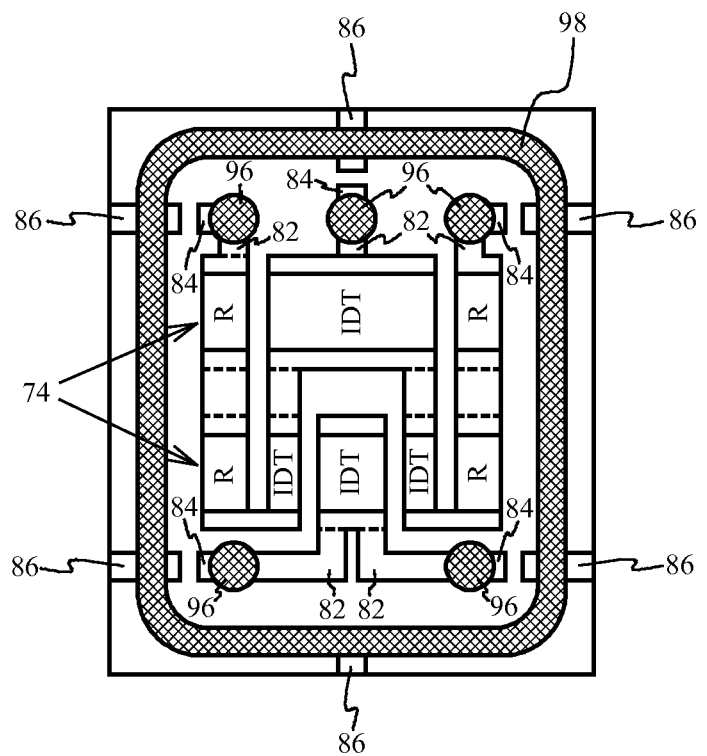

Referring to FIG. 1D and FIG. 3B, the photoresist 94 is removed, and wirings 84 are then cut by irradiating the wirings 84 with a laser beam 99. Accordingly, the protrusion electrodes 96 and the seal ring 98 are electrically separated from each other. Instead of the laser beam 99, the wirings 84 may be cut by the photo etching process. After that, the wafer is cut in the cutting region 80 into individual pieces to produce bare chip mounting type acoustic wave devices. The acoustic wave device in accordance with the first comparative example is obtained by bonding the protrusion electrodes 96 and the seal ring 98 of the bare chip mounting type acoustic wave device to the mounting substrate.

As described above, according to the first comparative example, the protrusion electrodes 96 and the seal ring 98 are formed simultaneously by the electrolytic plating method, and are easily made nearly equal in height to each other. Thus, it is possible to prevent the electrical characteristics from being degraded due to a defective connection between the protrusion electrodes 96 and the mounting substrate and to prevent the hermetic seal from being degraded due to a defective bonding of the seal ring 98 to the mounting substrate.

However, sufficient electrical characteristics may not be obtained in a state in which the protrusion electrodes 96 and the seal ring 98 are electrically interconnected. Thus, as described in FIG. 1D and FIG. 3B, the protrusion electrodes 96 and the seal ring 98 are electrically separated from each other by cutting the wirings 84 by irradiating the wirings 84 with the laser beam 99 or applying the photo etching process to the wirings 84. As described above, the acoustic wave device of the first comparative example has the step of removing wirings 84, which increases the number of fabrication steps. In removal of the wirings 84, a foreign material may adhere during the irradiation of the laser beam 99 or the photo etching process.

Now, a description is given of an acoustic wave device that is made with the above in mind and is capable of making the height of the protrusion electrode and the height of the seal ring nearly equal to each other and achieving reduction in the number of fabrication steps and quality improvement.

First Embodiment

FIG. 4A through FIG. 5D are cross-sectional schematic views illustrating a fabrication method of an acoustic wave device in accordance with a first embodiment. FIG. 6A through FIG. 8 are top schematic views illustrating the fabrication method of the acoustic wave device in accordance with the first embodiment. A bare chip mounting type acoustic wave device may be fabricated by using a piezoelectric substrate in a wafer state. Although the wafer has a region in which multiple acoustic wave devices are to be formed, for the sake of convenience, only one of the acoustic wave devices is illustrated and described in FIG. 4A through FIG. 5C, and only two of acoustic wave devices are illustrated and described in FIG. 6A through FIG. 8.

Referring to FIG. 4A through FIG. 6A, a metal layer 12 including IDT electrodes, reflection electrodes and wirings is formed on a substrate 10 made of a piezoelectric material such as LN or LT. Thus, multiple surface acoustic wave elements 14, each having IDT and reflection electrodes, are formed on the substrate 10. The metal layer 12 is made of Al for example, and can be formed by the evaporation method and the liftoff technique, or by the sputtering technique and the etching method.

The first embodiment described below is an exemplary multimode surface acoustic wave filter configured to have two surface acoustic wave elements 14 connected in series and have an unbalanced input/balanced output structure. One of the two surface acoustic wave elements 14 is composed of an IDT electrode 1 and reflection electrodes R1 located at both sides of the IDT electrode 1 in the propagation direction of the acoustic wave, and the other is composed of an IDT electrode 2, IDT electrodes 3 and reflection electrodes R2 located at both sides of them in the propagation direction of the acoustic wave. The IDT electrode 1 and IDT electrodes 3 are connected together by the wirings 16, and accordingly, two surface acoustic wave elements 14 are connected together in series. In addition, reflection electrodes R1 and reflection electrodes R2 are connected by the wirings 18. When an unbalanced signal is input to the IDT electrode 1, the signal is transmitted to IDT electrodes 3 through the wirings 16, and is output from the IDT electrode 2 as a balanced signal.

In addition, the metal layer 12 is also formed in regions 20 in which first pad electrodes are to be formed, regions 22 in which first circular electrodes are to be formed, and a cutting region 24 used for cutting the wafer into individual pieces, each of which includes the multiple surface acoustic wave elements 14. Here, the metal layer 12 formed in the cutting region 24 is referred to as a third wiring 31. In addition, the metal layer 12 includes wirings 26 interconnecting the surface acoustic wave elements 14 and the metal layer 12 in the regions 20, first wirings 28 interconnecting the metal layer 12 in the regions 20 and the third wiring 31 in the cutting region 24, and second wirings 30 interconnecting the metal layers 12 in the regions 22 and the third wiring 31 in the cutting region 24. In addition, the third wiring 31 in the cutting region 24 is electrically connected to both the first wirings 28 and the second wirings 30. As will be apparent from the later description, the first wirings 28, the second wirings 30 and the third wiring 31 are used as a plating power-supply line used in the electrolytic plating method.

Figure 9:
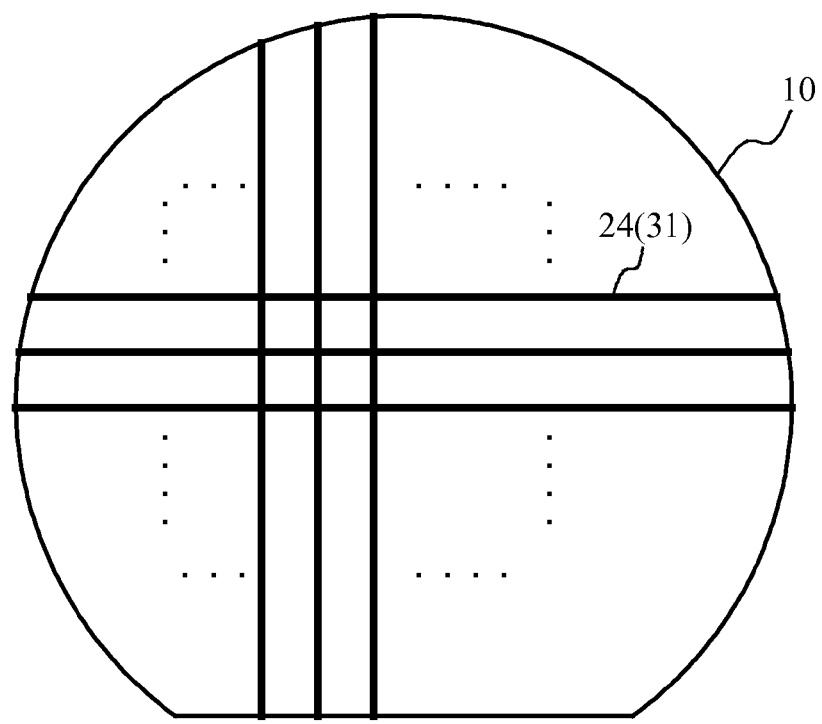
FIG. 9 is a top schematic view illustrating a cutting region formed in a substrate in a wafer state.

FIG. 9 is a top schematic view illustrating the cutting region 24 formed in the substrate 10 in the wafer state. Referring to FIG. 9, the cutting region 24 having the third wiring 31 is formed in the surface of the substrate 10 in the wafer state in a grid shape.

Figure 4A:
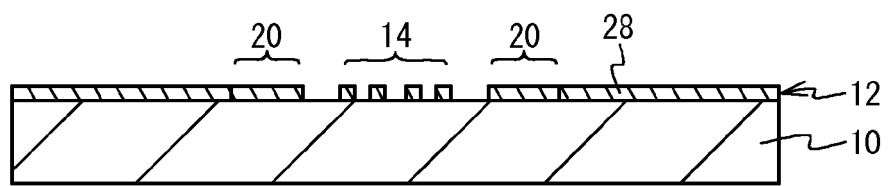
FIG. 4A through FIG. 4C are cross-sectional schematic views (No. 1) illustrating a fabrication method of an acoustic wave device in accordance with a first embodiment.
Figure 4B:
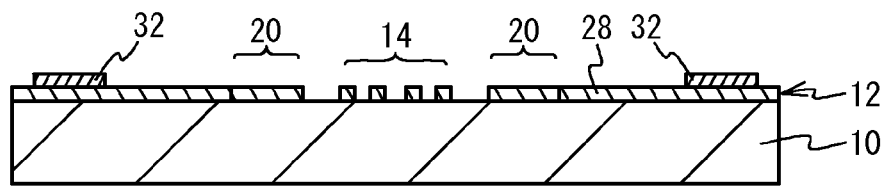
Figure 6A:
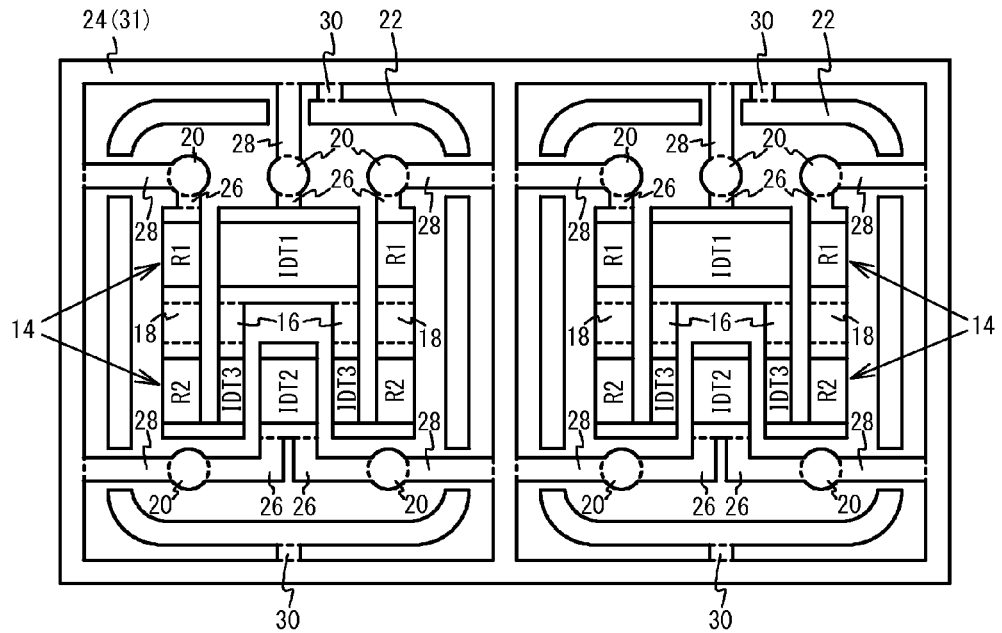
FIG. 6A and FIG. 6B are top schematic views (No. 1) illustrating the fabrication method of the acoustic wave device in accordance with the first embodiment.
Figure 6B:
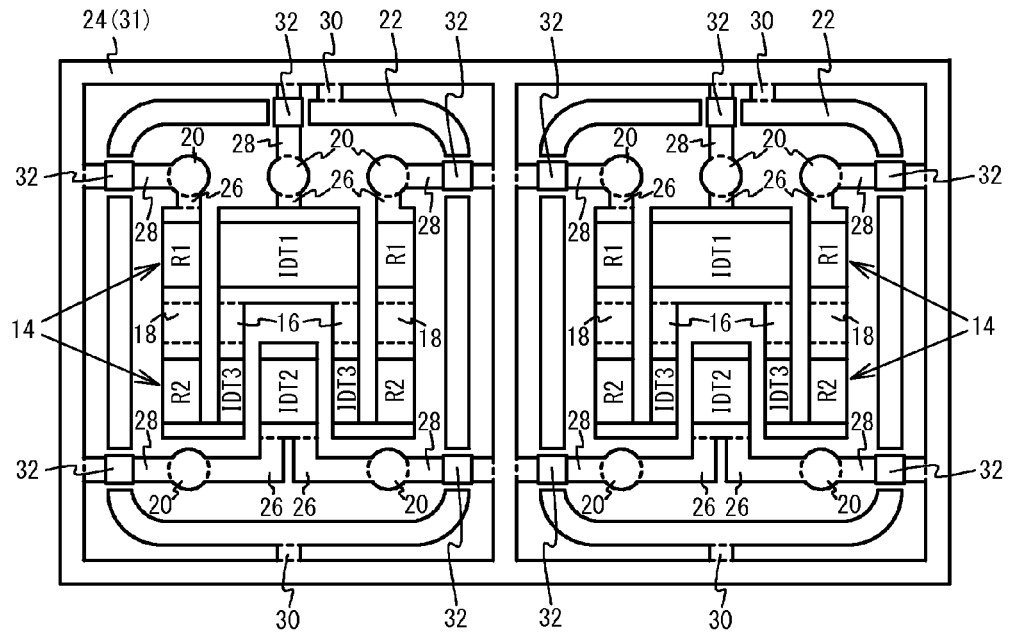

Referring to FIG. 4B and FIG. 6B, after the metal layer 12 is formed, insulators 32 are formed on the first wirings 28 in regions in which the first circular electrodes to be formed later intersect with the first wirings 28. It is preferable that the insulators 32 are formed in a region larger than the intersecting region so as to cover the whole region in which the first circular electrode to be formed later intersects with the first wiring 28 for example. The insulators 32 may be made of polyimide for example, and have a film thickness of 1 µm for example. The insulators 32 made of polyimide may be formed by forming a mask layer having apertures in the regions in which the first circular electrodes to be formed later intersect with the first wirings 28 on the substrate 10, and applying polyimide so that the polyimide is embedded in the apertures.

Figure 4C:
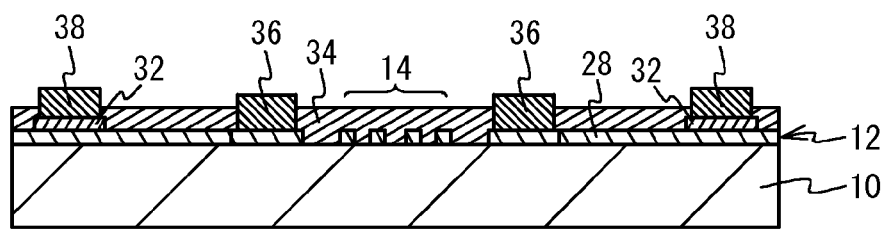
Figure 7A:
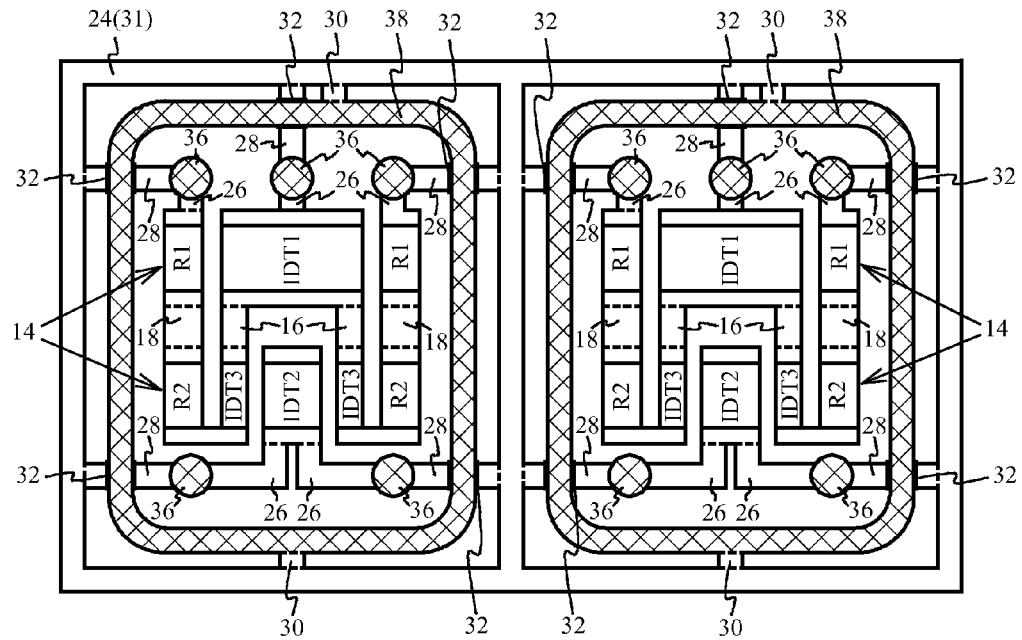
FIG. 7A and FIG. 7B are top schematic views (No. 2) illustrating the fabrication method of the acoustic wave device in accordance with the first embodiment.

Referring to FIG. 4C and FIG. 7A, a protective film 34 is formed on the substrate 10 so as to cover surface acoustic wave elements 14. In FIG. 7A, the protective film 34 is illustrated transparently (this also applies to FIG. 7B and FIG. 8). The protective film 34 is an oxide silicon film formed by sputtering, for example. In addition to sputtering, CVD (Chemical Vapor Deposition) or ALD (Atomic Layer Deposition) may be used. After that, the protective film 34 in the regions 20 and the protective film 34 in the region in which the first circular electrodes are to be formed are removed, and first pad electrodes 36 having Ti and Au layers sequentially stacked in this order from the metal layer 12 side are formed on the metal layers 12 in the regions 20. In addition, first circular electrodes 38 in which Ti and Au are sequentially stacked from the insulator 32 side is formed on the insulators 32 in the region in which the first circular electrodes are to be formed. Thus, on the substrate 10, formed are the first pad electrodes 36 electrically connected to the surface acoustic wave elements 14, and the first circular electrodes 38, each of which completely surrounds the two surface acoustic wave elements 14 and the first pad electrodes 36 electrically connected to the two surface acoustic wave elements 14. The first pad electrodes 36 and the first circular electrodes 38 may be formed by the sputtering technique and the etching method for example, and it is preferable that the first pad electrodes 36 and the first circular electrodes 38 are formed simultaneously in terms of making their film thicknesses nearly equal to each other.

Figure 5A:
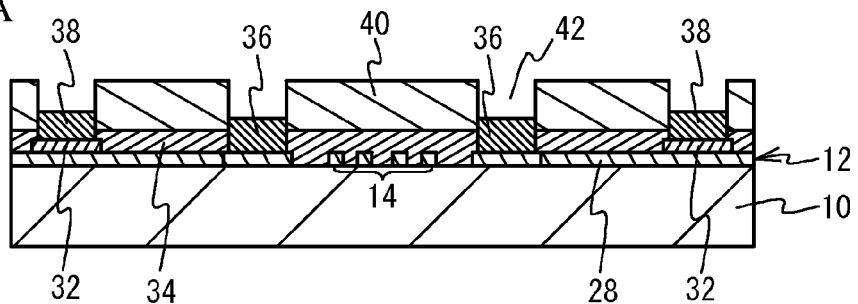
FIG. 5A through FIG. 5D are cross-sectional schematic views (No. 2) illustrating the fabrication method of the acoustic wave device in accordance with the first embodiment.

Referring to FIG. 5A, a photoresist 40 is applied on the substrate 10, and apertures 42 are then formed by removing the photoresist 40 on the first pad electrodes 36 and the first circular electrode 38.

Figure 5B:
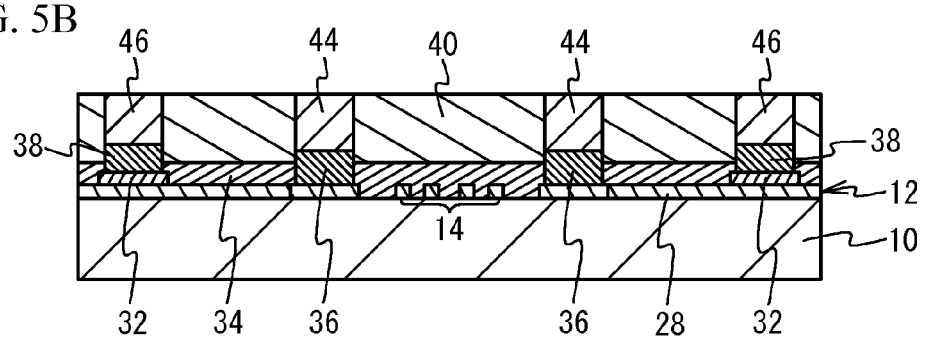
Figure 7B:
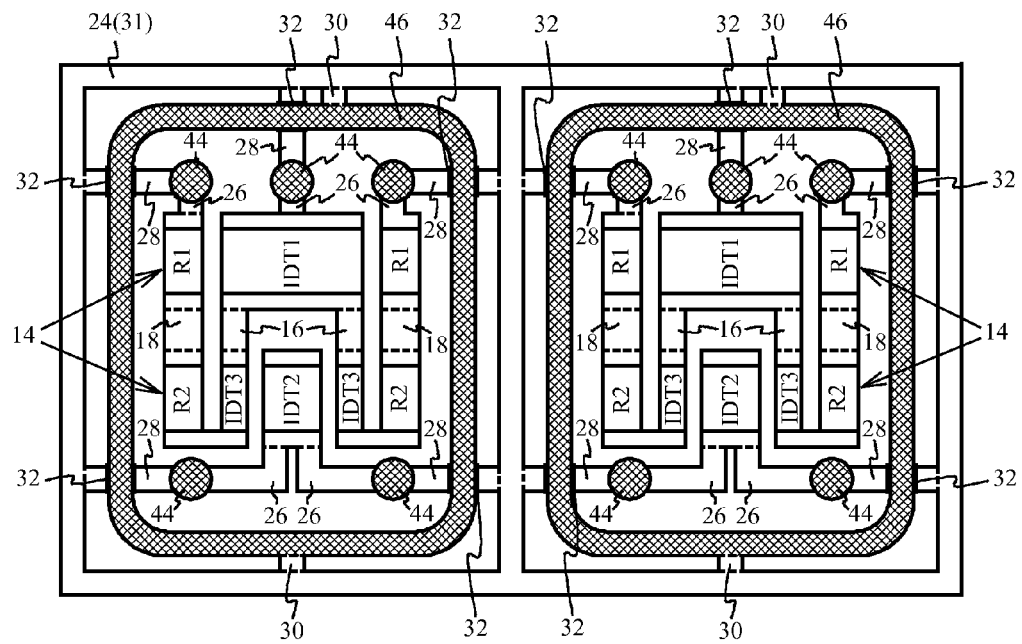

Referring to FIG. 5B and FIG. 7B, the electrolytic plating method is used to simultaneously form protrusion electrodes 44 to be embedded in the apertures 42 located above the first pad electrodes 36 and the seal rings 46 to be embedded in apertures 42 located above the first circular electrodes 38. This process results in the protrusion electrodes 44 electrically connected to the surface acoustic wave elements 14, and the seal rings 46, each of which completely surrounds the two surface acoustic wave elements 14 as well as the protrusion electrodes 44 electrically connected to the two surface acoustic wave elements 14. The upper surfaces of the protrusion electrodes 44 and those of the seal rings 46 are formed so as to be located higher than the surface acoustic wave elements 14. In FIG. 7B, the photoresist 40 is illustrated transparently.

As described in FIG. 9, the cutting region 24 having the third wiring 31 is formed in the surface of the substrate 10 in the wafer state so as to have a grid shape. Moreover, the first pad electrodes 36 are electrically connected to the third wiring 31 via the first wirings 28, and the first circular electrodes 38 are electrically connected to the third wiring 31 via the second wirings 30. Accordingly, by connecting an electrode for electrolytic plating to the outer periphery of the substrate 10 in the wafer state, it is possible to flow a current to the first pad electrodes 36 via the first wirings 28 and to the first circular electrodes 38 via the second wirings 30 across the entire surface of the wafer, and to thus form the protrusion electrodes 44 and the seal rings 46 simultaneously. As described above, the first wirings 28, the second wirings 30, and the third wiring 31 are used as a plating power-supply line used in the electrolytic plating method.

As the protrusion electrodes 44 and the seal rings 46 are formed simultaneously, they are made of a same material and have a same film thickness. The protrusion electrodes 44 and the seal rings 46 have a film thickness of 30 μm to 50 μm for example. The protrusion electrodes 44 and the seal rings 46 may be formed by using Ni, Cu, or solder for example. The insulators 32 are provided on the bottom sides of the seal rings 46, but are not provided on the bottom sides of the protrusion electrodes 44. Thus, technically, the upper surfaces of the protrusion electrodes 44 and those of the seal rings 46 are not flush with each other. However, the film thickness of the insulator 32 is very thin against the film thicknesses of the protrusion electrode 44 and the seal ring 46, and the film thickness of the insulator 32 is thus negligible. Therefore, it is possible to consider that the heights of the protrusion electrodes 44 and those of the seal rings 46 are nearly equal to each other, and that the upper surfaces of the protrusion electrodes 44 and the upper surfaces of the seal rings 46 are substantially flush with each other so as to form a planar surface.

Figure 5C:
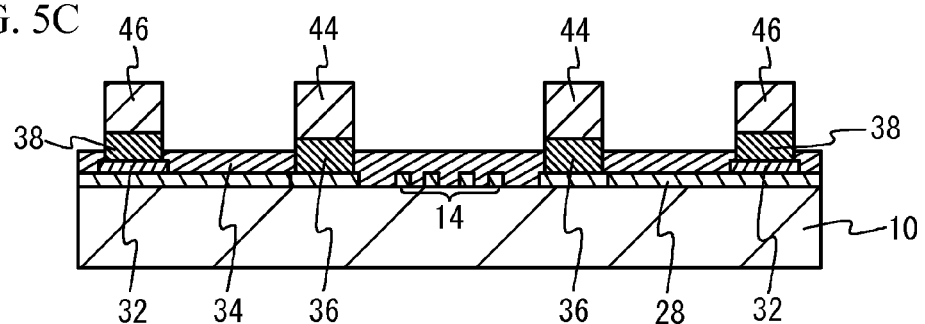
Figure 8:
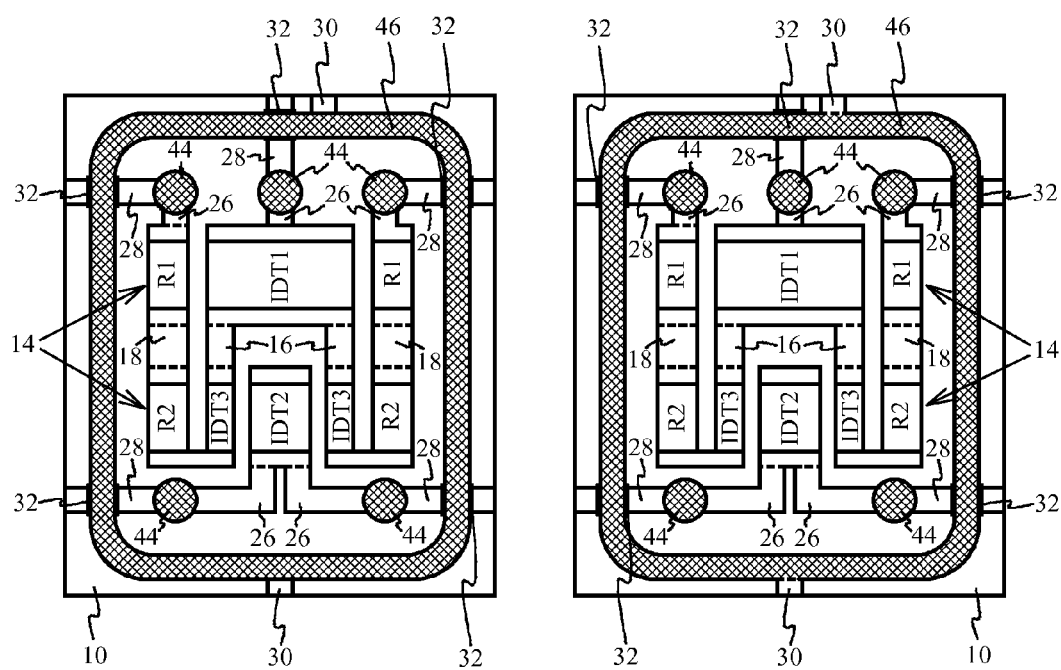
FIG. 8 is a top schematic view (No. 3) illustrating the fabrication method of the acoustic wave device in accordance with the first embodiment.

Referring to FIG. 5C and FIG. 8, after the protrusion electrodes 44 and the seal rings 46 are formed, the photoresist 40 is removed. After that, the cutting region 24 is cut by the dicing method for example, and the wafer is divided into individual pieces or chips each including multiple surface acoustic wave elements 14. Accordingly, multiple acoustic wave devices of the bare chip mounting type are obtained. The third wiring 31 formed in the cutting region 24 is removed at the same time as dicing in the cutting region 24. Thus, it is possible to electrically separate the first wirings 28 and the second wirings 30 connected to the third wiring 31 from each other. The insulators 32 are formed on the first wirings 28 in the regions in which the first wiring 28 intersects with the seal ring 46. Thus, by removing the third wiring 31 to electrically separate the first wirings 28 and the second wirings 30 from each other, it is possible to electrically separate the protrusion electrodes 44 and the seal ring 46 from each other.

Figure 5D:
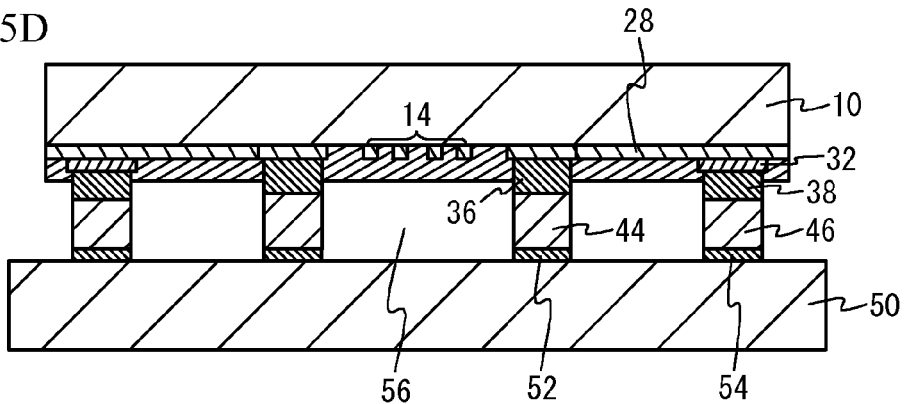

Referring to FIG. 5D, a mounting substrate 50 on which second pad electrodes 52 and a second circular electrode 54 are formed is fabricated in parallel with the fabrication of the bare chip mounting type acoustic wave device. The mounting substrate 50 may be made of an insulating substrate such as ceramic. The second pad electrodes 52 and the second circular electrode 54 are formed by sputtering and etching for example, and have a structure having Ti and Au layers sequentially stacked in this order from the mounting substrate 50 side. The second pad electrodes 52 are formed to be located in positions facing the protrusion electrodes 44, and the second circular electrode 54 is formed to be located in a position facing the seal ring 46. It is preferable that the second pad electrodes 52 and the second circular electrode 54 are formed simultaneously in order to make their film thicknesses nearly equal to each other.

The upper surfaces of protrusion electrodes 44 of the bare chip mounting type acoustic wave device are bonded to the second pad electrodes 52 via solder for example. At the same time, the upper surface of the seal ring 46 of the bare chip mounting type acoustic wave device is bonded to the second circular electrode 54 via solder for example. As the protrusion electrodes 44 and the seal ring 46 are formed to be located higher than the surface acoustic wave elements 14, it is possible to hermetically seal the surface acoustic wave elements 14 and form a sealed space 56 above the surface acoustic wave elements 14 by bonding the seal ring 46 to the second circular electrode 54.

As described above, according to the first embodiment, the surface acoustic wave elements 14 are formed on the substrate 10 (first substrate) as illustrated in FIG. 4A and FIG. 6A. As illustrated in FIG. 5B and FIG. 7B, simultaneously formed by electrolytic plating are the protrusion electrodes 44 electrically connected to the surface acoustic wave elements 14 and the seal rings 46, each of which surrounds some of the surface acoustic wave elements 14 and some of the protrusion electrodes 44 electrically connected to these surface acoustic wave elements 14. After that, as illustrated in FIG. 8, the wafer is divided into individual pieces, each of which includes the surface acoustic wave elements 14, and simultaneously, the plating power-supply line used in electrolytic plating is cut. This process electrically separates the protrusion electrodes 44 electrically connected to the individual surface acoustic wave elements 14 from the seal ring 46 surrounding the surface acoustic wave elements 14.

It is possible to make the heights of protrusion electrodes 44 and those of the seal ring 46 nearly equal to each other by forming the protrusion electrodes 44 and the seal ring 46 simultaneously by electrolytic plating. Thus, as illustrated in FIG. 5D, when the acoustic wave device of the bare chip mounting type is flip-chip mounted on the mounting substrate 50, it is possible to suppress the occurrence of poor electrical characteristics caused by failing to bond the protrusion electrodes 44 to the second pad electrodes 52, and the occurrence of poor hermetical seal caused by failing to band the seal ring 46 to the second circular electrode 54.

In addition, the step of removing the wiring employed in the first comparative example becomes unnecessary by dividing the wafer into pieces each having the surface acoustic wave elements 14 and simultaneously cutting the plating power-supply line so as to electrically separate the protrusion electrodes 44 and the seal ring 46 from each other. Accordingly, the number of fabrication steps is reduced. In addition, it is possible to suppress the occurrence of adherence of the foreign material and to improve the quality. Thus, according to the first embodiment, it is possible to make the heights of protrusion electrodes 44 and those of the seal ring 46 nearly equal to each other and to reduce the number of fabrication steps and improve the quality.

As illustrated in FIG. 6A, the plating power-supply line is preferably composed of wirings on the substrate 10 including the third wiring 31 extending in the cutting region 24, the first wirings 28 extending from the third wiring 31 to the regions in which the protrusion electrodes 44 are to be formed, and the second wirings 30 extending from the third wiring 31 to the region in which the seal ring 46 is to be formed. That is to say, it is preferable that the first wirings 28 extending to the regions in which the protrusion electrodes 44 are to be formed and the second wirings 30 extending to the region in which the seal ring 46 is to be formed are formed as independent wirings connected in common to the third wiring 31. In addition, as illustrated in FIG. 8, it is preferable that the protrusion electrodes 44 and the seal ring 46 are electrically separated by separating the wafer into the individual pieces each including some surface acoustic wave elements 14 and simultaneously removing the third wiring 31 extending in the cutting region 24. Accordingly, it is possible to electrically separate the protrusion electrodes 44 from the seal ring 46 easily and reliably at the same time as dicing the wafer into the individual pieces each including some surface acoustic wave elements 14.

As illustrated in FIG. 4B and FIG. 6B, it is preferable that the insulators 32 are formed on the first wirings 28 in the regions in which the first wiring 28 intersects with the region in which the first circular electrode 38 is to be formed, and as illustrated in FIG. 5B and FIG. 7B, it is preferable that the seal ring 46 is formed on the first circular electrode 38. That is to say, it is preferable that the insulators 32 are formed between first wirings 28 and the seal ring 46. Accordingly, even in a case where the seal ring 46 completely surrounds the periphery of the surface acoustic wave elements 14 and protrusion electrodes 44, it is possible to electrically separate protrusion electrodes 44 and the seal ring 46 by performing the step of dividing the wafer into pieces each having the surface acoustic wave elements 14 and the step of removing the third wiring 31 simultaneously.

It is difficult to obtain sufficient electrical characteristics when the protrusion electrode 44 for signal input/output is electrically connected to the seal ring 46, but there is a case where sufficient electrical characteristics can be obtained even though the protrusion electrode 44 for grounding is electrically connected to the seal ring 46. Therefore, it is preferable that the insulator 32 is formed between the first wiring 28 extending to a region in which the protrusion electrode 44 for signal input/output is to be formed and the seal ring 46 so that the first wiring 28 extending to a region in which at least the protrusion electrode 44 for signal input/output included in protrusion electrodes 44 is to be formed and the seal ring 46 are electrically separated. When the insulator 32 is not formed between the first wiring 28 extending to the region in which the protrusion electrode 44 for grounding is to be formed and the seal ring 46, it is possible that the seal ring 46 has a ground potential.

In addition, if the first wirings 28 and the seal ring 46 become electrically separated, in addition to forming the insulators 32 between the first wirings 28 and the seal ring 46, the first wirings 28 and the seal ring 46 may sterically intersect with each other sandwiching the air between them. That is to say, it is preferable that the first wirings 28 and the seal ring 46 have a three-dimensional wiring structure so that the first wirings 28 and the seal ring 46 are electrically separated from each other. The three-dimensional wiring structure is achieved, as described above, by making the first wirings 28 and the seal ring 46 intersect with each other placing the insulator 32 between them, or by making the first wirings 28 and the seal ring 46 intersect with each other sandwiching the air.

As illustrated in FIG. 5D, on the mounting substrate 50 (second substrate), second pad electrodes 52 are formed in positions facing the protrusion electrodes 44, and the second circular electrode 54 is formed in the position facing the seal ring 46. Then, the protrusion electrodes 44 electrically connected to the surface acoustic wave elements 14 in each of the pieces are bonded to the second pad electrodes 52, and the seal ring 46 surrounding the surface acoustic wave elements 14 in each of the pieces is bonded to the second circular electrode 54. Accordingly, it is possible to form the sealed space 56 above the surface acoustic wave elements 14, and to suppress the characteristics degradation of the surface acoustic wave elements 14.

As described in FIG. 5B and FIG. 7B, as the protrusion electrodes 44 and the seal ring 46 are formed simultaneously, they are made of a same material. Accordingly, when the bare chip mounting type acoustic wave device is mounted to the mounting substrate 50, it is possible to bond the protrusion electrodes 44 and the second pad electrodes 52 and bond the seal ring 46 and the second circular electrode 54 under the same conditions. Ni, Cu, or solder (for example, Sn, Au—Sn based solder, or Sn—Ag based solder) may be used for the protrusion electrodes 44 and the seal ring 46. The corrosion resistance is improved by using Ni. The resistivity can be improved by using Cu. A solder mounting by reflow becomes possible by using solder.

In addition, the bare chip mounting type acoustic wave device fabricated by the fabrication method described in FIG. 4A through FIG. 5C and FIG. 6A through FIG. 8 includes the surface acoustic wave elements 14, the protrusion electrodes 44 electrically connected to the surface acoustic wave elements 14, and the first wirings 28 extending from the edge of the substrate 10 and electrically connected to the protrusion electrodes 44 on the substrate 10 as illustrated in FIG. 5C and FIG. 8. In addition, on the substrate 10, included are the seal ring 46 that surrounds the surface acoustic wave elements 14 and the protrusion electrodes 44 is electrically separated from the protrusion electrodes 44 by intersecting with the first wirings 28 with a three-dimensional wiring structure, and the second wirings 30 that extend from the edge of the substrate 10 are electrically connected to the seal ring 46 and are electrically separated from the first wirings 28. Therefore, as described above, the acoustic wave device having the above-described structure is configured to have almost the same heights of protrusion electrodes 44 as those of the seal ring 46, and is capable of reducing the number of fabrication steps and improving the quality.

The above-described first embodiment is configured to have the seal ring 46 that surrounds two surface acoustic wave elements 14 out of the multiple acoustic wave elements 14 formed on the substrate 10 and the protrusion electrodes 44 electrically connected to the two surface acoustic wave elements 14. However, the first embodiment is not limited to the above but may be varied so that the seal ring 46 surrounds some of the surface acoustic wave elements 14 formed on the substrate 10 and the protrusion electrodes 44 electrically connected to these surface acoustic wave elements 14. That is to say, the present invention is not limited to the arrangement of the seal ring 46 that surrounds the two surface acoustic wave elements 14, but may be varied so that the seal ring 46 surrounds a single surface acoustic wave element 14 or more than two surface acoustic wave elements 14.

The first embodiment is not limited to the surface acoustic wave element 14 but may be varied so that the acoustic wave element is a piezoelectric thin film resonant element. For the piezoelectric thin film resonant element, the substrate 10 may be a substrate that does not have piezoelectricity such as a silicon substrate, a glass substrate, and a quartz substrate. The insulator 32 is not limited to polyimide but may be another type of insulator, which may be an organic-based insulator such as resin or an inorganic-based insulator such as oxide silicon or silicon nitride.

Second Embodiment

Figure 10A:
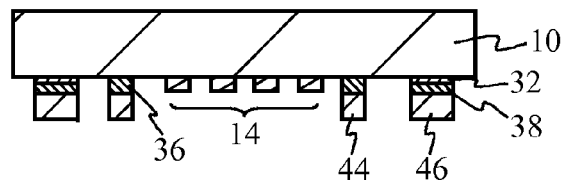
FIG. 10A through FIG. 10D are cross-sectional schematic views illustrating a fabrication method of an acoustic wave device in accordance with a second embodiment.

A second embodiment is an exemplary acoustic wave device in which a bare chip mounting type acoustic wave device is mounted on the mounting substrate to which a chip component is mounted. FIG. 10A through FIG. 10D are cross-sectional schematic views illustrating a fabrication method of an acoustic wave device in accordance with the second embodiment. Referring to FIG. 10A, the bare chip mounting type acoustic wave device is fabricated by the fabrication method described in FIG. 4A through FIG. 5C and FIG. 6A through FIG. 8. In FIG. 10A, for simplification, the illustration of the metal layer 12 and the protective film 34 is omitted.

Figure 10B:
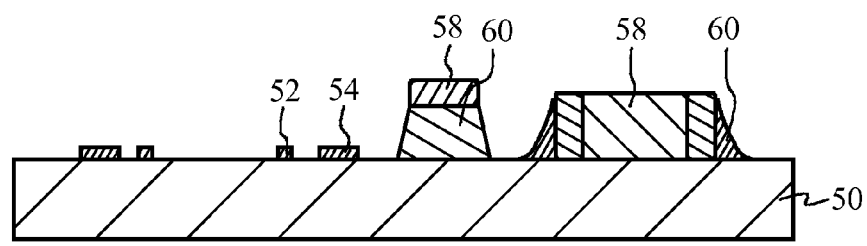

Referring to FIG. 10B, in parallel with the fabrication of the bare chip mounting type acoustic wave device, the mounting substrate 50 is prepared on which the second pad electrodes 52 and the second circular electrode 54 are formed and chip components 58 are mounted. The mounting substrate 50 may be an insulative substrate such as ceramic. The second pad electrodes 52 and the second circular electrode 54 may be made of solder for example. The second pad electrodes 52 are formed to be located in positions facing the protrusion electrodes 44, and the second circular electrode 54 is formed to be located in a position facing the seal ring 46. It is preferable that second pad electrodes 52 and the second circular electrode 54 are formed simultaneously to have equal thicknesses of these electrodes. The chip components 58 may be a chip resistor, a chip capacitor, a chip inductor or the like, and are mounted by solder 60.

Figure 10C:
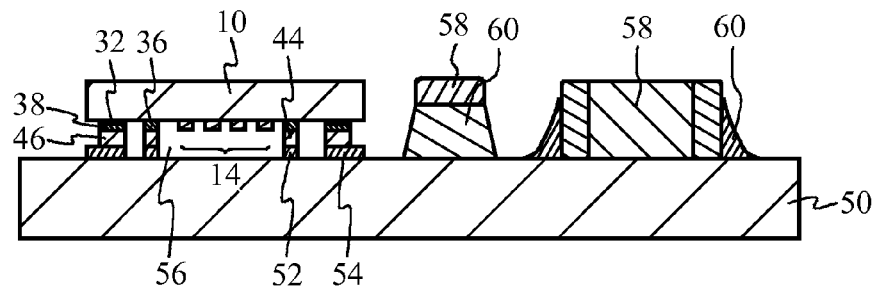

Referring to FIG. 10C, the upper surfaces of the protrusion electrodes 44 are bonded to the second pad electrodes 52, and at the same time the upper surface of the seal ring 46 is bonded to the second circular electrode 54. Accordingly, the bare chip mounting type acoustic wave device is flip-chip mounted on the mounting substrate 50. As the protrusion electrodes 44 and the seal ring 46 are formed to be located higher than the surface acoustic wave elements 14, it is possible to hermetically seal the surface acoustic wave elements 14 and form the sealed space 56 above the surface acoustic wave elements 14 by bonding the seal ring 46 to the second circular electrode 54.

Figure 10D:
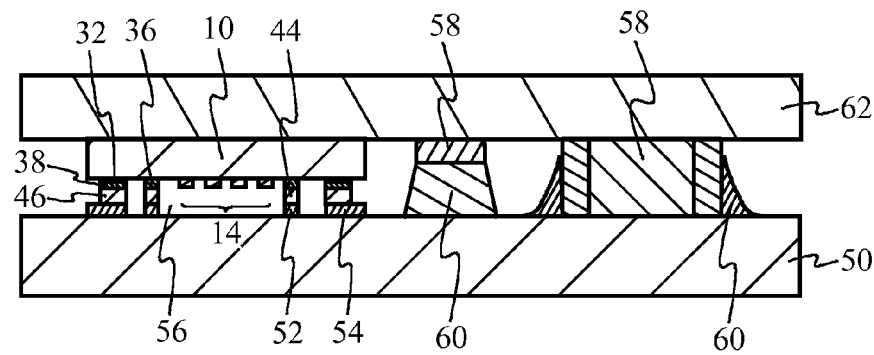

Referring to FIG. 10D, a top plate 62 made of a glass epoxy based resin for example is formed on the substrate 10 and chip components 58 mounted on the mounting substrate 50 so as to cover them. Accordingly, the acoustic wave device in accordance with the second embodiment is completed. Instead of the top plate 62, a mold resin portion may be formed so as to cover the substrate 10 and chip components 58 mounted on the mounting substrate 50. Here, the top plate 62 made of resin and the mold resin portion that cover the substrate 10 and chip components 58 on the mounting substrate 50 are collectively called a resin sealing portion.

According to the second embodiment, as illustrated in FIG. 10C, the bare chip mounting type acoustic wave device is mounted on the mounting substrate 50 by bonding the protrusion electrodes 44 to the second pad electrodes 52 formed on the mounting substrate 50 (second substrate), and bonding the seal ring 46 to the second circular electrode 54 formed on the mounting substrate 50. Then, as illustrated in FIG. 10D, the resin sealing portion is formed so as to cover the substrate 10 mounted on the mounting substrate 50 and the like. In a case where the step of removing the wiring is performed as described in the first comparative example, as the adherence of the foreign material easily occurs and the resin in the resin sealing portion is easily charged, the ESD (ElectroStatics Discharge) breaking fault may occur in the electrode finger part of the IDT electrode formed at a fine interval. On the other hand, in the second embodiment, as the bare chip mounting type acoustic wave device which does not need the step of removing the wiring is used, the adherence of the foreign material does not easily occur, and the occurrence of the ESD breakdown in the IDT electrode is suppressed even though sealed by the resin sealing portion.

Although the embodiments of the present invention have been described in detail, it is to be understood that the various change, substitutions, and alterations could be made hereto without departing from the spirit and scope of the invention.

What is claimed is:

1. A fabrication method of an acoustic wave device comprising:
   forming acoustic wave elements on a first substrate;
   forming protrusion electrodes and seal rings on the first substrate simultaneously by an electrolytic plating method, the protrusion electrodes being electrically connected to the acoustic wave elements, each of the seal rings surrounding related acoustic wave elements out of the acoustic wave elements and related protrusion electrodes out of the protrusion electrodes electrically connected to the related acoustic wave elements; and
   cutting a plating power-supply line used in the electrolytic plating method in a step of dividing the first substrate into pieces, each including a corresponding one of the seal rings so as to electrically separate the related acoustic wave elements from the corresponding one of the seal rings.

2. The fabrication method according to claim 1, further comprising:
   forming, as the plating power-supply line, a third wiring extending in a cutting region used in the cutting, first wirings extending from the third wiring to regions in which the protrusion electrodes are to be formed, and second wirings extending from the third wiring to regions in which the seal rings are to be formed on the first substrate, wherein
   the cutting of the plating power-supply line including removing the third wiring in the step of dividing.

3. The fabrication method according to claim 2, wherein
   the forming includes forming a three-dimensional wiring structure in which one of the first wirings extending to a region in which a signal input/output terminal is electrically separated from the corresponding one of the seal rings.

4. The fabrication method according to claim 3, wherein
   the forming of the three-dimensional wiring structure includes forming an insulator between the one of the first wirings and the corresponding one of the seal rings.

5. The fabrication method according to claim 1, further comprising:
   forming pad electrodes in positions facing the protrusion electrodes and circular electrodes in positions facing the seal rings on a second substrate; and
   bonding the protrusion electrodes in the pieces to the pad electrodes and bonding the seal rings in the pieces to the circular electrodes.

6. The fabrication method according to claim 5, further comprising:
   forming a resin sealing portion so as to cover the first substrate in each of the pieces mounted on the second substrate.

7. The fabrication method according to claim 1, wherein
   the protrusion electrodes and the seal rings are made of a same material.

8. The fabrication method of an acoustic wave device according to claim 1, wherein
   the protrusion electrodes and the seal rings are made of Ni, Cu or solder.

* * * * *